United States Patent
Rebhan

(10) Patent No.: US 9,640,510 B2
(45) Date of Patent: May 2, 2017

(54) METHOD FOR BONDING METALLIC CONTACT AREAS WITH SOLUTION OF A SACRIFICIAL LAYER APPLIED ON ONE OF THE CONTACT AREAS

(71) Applicant: EV GROUP E. THALLNER GMBH, St. Florian am Inn (AT)

(72) Inventor: Bernhard Rebhan, Haag a. H. (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/787,397

(22) PCT Filed: Jul. 5, 2013

(86) PCT No.: PCT/EP2013/064239
§ 371 (c)(1),
(2) Date: Oct. 27, 2015

(87) PCT Pub. No.: WO2015/000527
PCT Pub. Date: Jan. 8, 2015

(65) Prior Publication Data
US 2016/0071817 A1  Mar. 10, 2016

(51) Int. Cl.
*H01L 21/00* (2006.01)
*H01L 23/00* (2006.01)
*H01L 21/66* (2006.01)

(52) U.S. Cl.
CPC ............ *H01L 24/83* (2013.01); *H01L 24/03* (2013.01); *H01L 24/05* (2013.01); *H01L 24/06* (2013.01);
(Continued)

(58) Field of Classification Search
CPC .......... H01L 21/2007; H01L 21/67028; H01L 24/83; H01L 24/03; H01L 24/05;
(Continued)

(56) References Cited

U.S. PATENT DOCUMENTS 4,612,083 A    9/1986  Yasumoto et al. ............ 156/633
5,603,779 A *  2/1997  Linn .................. H01L 21/2007
                                                148/DIG. 12
(Continued)

FOREIGN PATENT DOCUMENTS

DE    3586732     4/1993  ............. H01L 21/82
DE    10018358   10/2000  ........... H01L 23/522
(Continued)

OTHER PUBLICATIONS

International Search Report from corresponding International Patent Application No. PCT/EP2013/064239, dated Jul. 29, 2014.
(Continued)

*Primary Examiner* — Alonzo Chambliss
(74) *Attorney, Agent, or Firm* — Kusner & Jaffe

(57) ABSTRACT

A method for bonding of a first, at least partially metallic contact surface of a first substrate to a second, at least partially metallic contact surface of a second substrate, with the following steps, especially the following progression: application of a sacrificial layer which is at least partially, especially predominantly soluble in the material of at least one of the contact surfaces to at least one of the contact surfaces, bonding of the contact surfaces with at least partial solution of the sacrificial layer in at least one of the contact surfaces.

13 Claims, 4 Drawing Sheets

(52) U.S. Cl.
CPC .............. *H01L 24/27* (2013.01); *H01L 24/29* (2013.01); *H01L 24/32* (2013.01); *H01L 24/743* (2013.01); *H01L 22/12* (2013.01); *H01L 2223/54426* (2013.01); *H01L 2224/0345* (2013.01); *H01L 2224/0381* (2013.01); *H01L 2224/03452* (2013.01); *H01L 2224/03602* (2013.01); *H01L 2224/03616* (2013.01); *H01L 2224/05561* (2013.01); *H01L 2224/05564* (2013.01); *H01L 2224/05567* (2013.01); *H01L 2224/05647* (2013.01); *H01L 2224/061* (2013.01); *H01L 2224/274* (2013.01); *H01L 2224/2741* (2013.01); *H01L 2224/2745* (2013.01); *H01L 2224/2781* (2013.01); *H01L 2224/2784* (2013.01); *H01L 2224/27444* (2013.01); *H01L 2224/27452* (2013.01); *H01L 2224/27464* (2013.01); *H01L 2224/27845* (2013.01); *H01L 2224/29023* (2013.01); *H01L 2224/29028* (2013.01); *H01L 2224/29187* (2013.01); *H01L 2224/8301* (2013.01); *H01L 2224/83011* (2013.01); *H01L 2224/83012* (2013.01); *H01L 2224/8312* (2013.01); *H01L 2224/83013* (2013.01); *H01L 2224/83026* (2013.01); *H01L 2224/8383* (2013.01); *H01L 2224/83121* (2013.01); *H01L 2224/83203* (2013.01); *H01L 2224/83907* (2013.01); *H01L 2924/00014* (2013.01); *H01L 2924/01029* (2013.01)

(58) Field of Classification Search
CPC ......... H01L 24/06; H01L 24/27; H01L 24/29; H01L 24/32; H01L 24/743
See application file for complete search history.

(56) References Cited

U.S. PATENT DOCUMENTS

| | | | | |
|---|---|---|---|---|
| 6,472,293 | B1 | 10/2002 | Suga | 438/455 |
| 6,984,873 | B2* | 1/2006 | Kloster | H01L 21/563 257/618 |
| 8,134,236 | B2 | 3/2012 | Otremba | 257/777 |
| 8,431,436 | B1 | 4/2013 | Nguyen | 438/107 |
| 9,159,717 | B2 | 10/2015 | Plach et al. | H01L 21/30 |
| 9,252,042 | B2* | 2/2016 | Plach | H01L 21/187 |
| 2005/0003652 | A1 | 1/2005 | Ramanathan et al. | 438/616 |
| 2006/0032582 | A1* | 2/2006 | Chen | H01L 24/83 156/272.6 |
| 2007/0232022 | A1* | 10/2007 | Henley | H01L 21/76254 438/455 |
| 2008/0006369 | A1* | 1/2008 | Lim | C09J 5/02 156/308.6 |
| 2009/0023243 | A1 | 1/2009 | Koyanagi | 438/107 |
| 2009/0023299 | A1 | 1/2009 | Yokonaga | 438/769 |
| 2012/0160903 | A1 | 6/2012 | Saitou et al. | 228/206 |
| 2014/0154867 | A1 | 6/2014 | Martinschitz et al. | 438/455 |

FOREIGN PATENT DOCUMENTS

| | | | | |
|---|---|---|---|---|
| DE | 102006031405 | | 1/2008 | ............. H01L 25/04 |
| DE | 10 2009 050 426 | | 3/2011 | ............. H01L 21/58 |
| DE | 102012219171 | | 5/2013 | ............ H01L 21/768 |
| EP | 2372755 | | 10/2011 | ............. H01L 21/60 |
| EP | 2390932 | | 11/2011 | ............. H01L 33/36 |
| EP | 2445000 | | 4/2012 | ............. H01L 21/60 |
| EP | 2466632 | | 6/2012 | ............. H01L 21/60 |
| FR | 2983845 | | 6/2013 | ............... B81C 3/00 |
| JP | H0246722 | | 2/1990 | ............. H01L 21/20 |
| JP | 2671419 | | 10/1997 | ............. H01L 21/20 |
| WO | WO 2006/020439 | | 2/2006 | |
| WO | WO 2007/060145 | | 5/2007 | ........... H01L 21/762 |
| WO | WO 2012/133760 | | 10/2012 | ............. H01L 25/10 |
| WO | WO 2012/136266 | | 10/2012 | |
| WO | WO 2013/029656 | | 3/2013 | ............. H01L 21/60 |
| WO | WO 2014/048502 | | 4/2014 | ............. B23K 20/02 |

OTHER PUBLICATIONS

Website printout from Wikipedia, the free encyclopedia "Wafer (electronics)," en.wikipedia.org/w/index.php?title=Wafer_(electronics)&oldid=560053119, print out date Jul. 15, 2014.

Gueguen et al., "3D Vertical Interconnects by Copper Direct Bonding." Materials Research Society Symposium Proceedings, vol. 1112, pp. 81-89, Dec. 3, 2008.

Di Cioccio et al., "Enabling 3D Interconnects with Metal Direct Bonding," Proceedings of the IEEE 2009 International Interconnect Technology Conference, (IITC 2009), Sapporo, Japan, Jun. 1-3, 2009, pp. 152-154, Jun. 1, 2009.

Verdaguer et al., "Growth and structure of water on SiO2 films on Si investigated by Kelvin probe microscopy and in situ X-ray Spectroscopies," Lawrence Berkeley National Laboratory, May 27, 2008, retrieved from escholarship.org/uc/item/3sw5003d.pdf on Jul. 18, 2014.

Office Action issued in corresponding European Patent Application No. 13 734 099.8-1552 dated May 31, 2016.

Haby, J., "What is Dry Air?," website printout from www.theweatherprediction.com, print out date May 24, 2016.

Bauer, J., et al., "Surface tension, adhesion and wetting of materials for photolithographic process," Journal of Vacuum Science & Technology, vol. B 14, pp. 2485-2492 (1996).

Written Opinion issued in corresponding Singapore Patent Application No. 11201600043R dated Aug. 16, 2016.

Search Report issued in corresponding Singapore Patent Application No. 11201600043R dated Aug. 1, 2016.

M. M. R. Howlader, et al., "Room-Temperature Microfluidics Packaging Using Sequential Plasma Activation Process," IEEE Transactions on Advanced Packaging, vol. 29, No. 3, Aug. 2006.

* cited by examiner

METHOD FOR BONDING METALLIC CONTACT AREAS WITH SOLUTION OF A SACRIFICIAL LAYER APPLIED ON ONE OF THE CONTACT AREAS

FIELD OF THE INVENTION

This invention relates to a method for bonding of a first contact surface of a first substrate to a second contact surface of a second substrate.

BACKGROUND OF THE INVENTION

So-called boding technology has been used for several years in the semiconductor industry. Bonding technology allows joining of two or more substrates which are generally aligned very precisely to one another. In most cases this joining takes place permanently, therefore irreversibly, which means that the separation of the two substrates after the bonding process is no longer possible without their destruction or at least their partial destruction. When the substrates are joined it is shown that there are different chemical and physical mechanisms which cause a permanent connection. Nonmetallic surfaces are especially interesting. In nonmetallic surfaces the formation of a so-called prebond occurs by pure contact-making.

This spontaneously forming, reversible connection of the two substrates which is caused via surface effects is called a prebond in order to distinguish it from the later actual bond which is no longer separable, therefore is irreversible, and which is caused by an additional heat treatment. The prebond which has been produced in this way is still characterized by a strength which should not be underestimated. Although wafers which have been joined to one another in this way must still be heat-treated at higher temperatures for a permanent bond, the strength of the prebond is sufficient to fix the two substrates until the next process step. The prebond is an extremely useful means for preliminary fixing of two substrates, mainly after an alignment process, since the two substrates after the alignment process should no longer move toward one another. The prebond should be based mainly on van der Waals forces which are present due to permanent and induced dipoles on the surface of the substrate. Since the van der Waals forces are very weak, a correspondingly high contact area is necessary so that a notable adhesion action occurs between the substrates. Unpolished solid surfaces however do not make optimum contact at correspondingly high roughness. In the case of pure solid contact, prebonds therefore arise mainly between the very flat polished substrate surfaces. At room temperatures, under certain circumstances already isolated covalent bonds can also form between the substrates surfaces, even without additional application of temperature and/or force to the substrates. The number of covalent bonds which have formed at room temperature should however be negligibly small.

Mainly the use of liquids could increase a corresponding adhesion action between substrates. On the one hand, the liquid equalizes the unevenness on the surfaces of the substrate and itself preferably forms even permanent dipoles. A pronounced prebond capacity is established mainly on nonmetallic surfaces. Semiconductors such as silicon, ceramics, here mainly oxides, metal oxides, which are polished and extremely flat, upon making contact show a corresponding behavior.

For nonmetallic surfaces, therefore surfaces which show a predominantly covalent bond character, such as for example Si, $SiO_2$, etc., a previously applied liquid film can even contribute to strengthening of the permanent bond by covalent bonds which arise during heat treatment. The nonmetallic surfaces are subjected to heat treatment after a prebond. The thermal activation produces covalent bonds between the surfaces and thus produces an irreversible connection. Thus single-crystalline, highly precisely cut and ground silicon wafers are welded to one another mainly by the formation of covalent bonds between the silicon atoms. If a silicon oxide is on a silicon wafer, mainly covalent silicon oxide bonds and/or oxide-oxide bonds form. It has been shown that the use of very thin liquid layers, generally of water, causes or at least improves the formation of covalent bonds between the surfaces. The liquid layers are only a few nanometers thick or even consist only of a single monolayer of the liquid. The liquid layers thus improve not necessarily only the prebond behavior, but also contribute significantly to the formation of covalent connections. The reason, in the case of water, lies mainly in making available oxygen as a connection atom between the atoms of the substrate surfaces which are to be bonded to one another. The binding energy between the hydrogen and the oxygen of a water molecule is low enough to be broken with the applied energy. New reaction partners for the oxygen are then mainly the atoms of the substrate surfaces. In any case it should be mentioned that there are surfaces in which these processes in which atoms of the liquid participate directly in the permanent bond process of the substrates surfaces need not necessarily occur.

The bond process for pure metal surfaces runs quite differently. Since metals behave chemically and physically completely differently due to their metallic bond nature, a completely different bond strategy is required. Metals are bonded to one another mainly at higher temperatures and generally under very high pressure. The high temperatures lead to intensified diffusion along the surfaces and/or the grain boundaries and/or the volume. Due to the increased mobility of the atoms, different physical and chemical effects occur which lead to a welding of the two surfaces. The disadvantage in these metal bonds therefore consists mainly in the use of very high temperatures and pressures to ensure a joining of the two substrates at all. In the overwhelming number of eases pure metal surfaces will not be found beforehand. Almost all metals except for very inert metals such as Pt, Au and Ag are coated in the atmosphere with an oxide layer, even if only very thin. This oxide layer is sufficient to produce a prebond even between the metal surfaces which are covered with a very thin oxide layer. In any case this oxide layer is in turn unwanted if the intention is to bond two metals directly to one another, for example to join two conductive contacts to one another.

Heat treatment of the substrates dictates correspondingly long heat-up and cooling times. The high temperatures can moreover lead to disruptions in functional units such as for example microchips and mainly in memory chips and can damage them to the point of not being usable.

Furthermore, substrates with corresponding surfaces can be aligned to one another prior to the actual bond step. This alignment, once carried out, should no longer be destroyed as far as the final, therefore permanent, bond process. In any case, mainly at higher temperatures, due to the different coefficients of thermal expansion of different materials and the resulting thermal stress, generally a shift of different component regions of the substrates to one another takes place. In the worst case the two substrates which are to be joined to one another are comprised of two different materials with different coefficients of thermal expansion. These shifts are the greater, the greater the difference of the coefficients of thermal expansion of the different materials.

SUMMARY OF THE INVENTION

The object of this invention is to devise a method as efficient as possible for low temperature and/or low pressure bonding of materials.

This object is achieved with the features of the independent claims(s). Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

The invention is based on the idea of depositing at least one ultrathin sacrificial layer on at least one of the contact surfaces of the substrates to be bonded, which layer during the bond step is dissolved in the material surrounding it or is consumed on the interface. Another aspect of the invention includes the bonding of metal surfaces by a prior wetting process with a material, especially at least predominantly a liquid, preferably at least predominantly water, as the sacrificial layer, is used especially for producing a prebond between the substrates. A combination of several sacrificial layers on top of one another is also conceivable, especially preferably the deposition of a solid sacrificial layer and a liquid sacrificial layer which has been deposited thereon. Generally therefore several sacrificial layers can also be applied on top of one another.

Although the disclosed invention is fundamentally suitable for all classes of materials which meet the necessary prerequisites, mainly metals are suitable for an embodiment of the invention. In the further disclosure an embodiment of the invention is illustrated by way of example on metal surfaces.

The substrate is comprised especially of silicon, an especially metallic bond layer preferably comprising Cu being applied at least in bond regions on the substrate. To the extent the bond layer does not cover the entire substrate, the bond regions are preferably surrounded by bulk material, especially of the substrate, and jointly form the especially plane contact surface.

According to another, especially independent aspect of this invention the bond regions which are to be bonded to one another are coated with a sacrificial layer which is on the one hand capable of producing a prebond whose atoms on the other hand after the prebond in temperature treatment as little as possible are dissolved by/in the material of the bond regions. The material layer is preferably comprised of a material in which at no time is the solubility limit for the material of the sacrificial layer reached. The material of the sacrificial layer disintegrates completely in the material layer on at least one of the contact surfaces, preferably on both contact surfaces. The concentration is given preferably in atomic percentage (at %). The solubility of the material of the sacrificial layer in especially metallic material of at least one of the contact surfaces is between 0 at % and 10 at %, preferably between 0 at % and 1 at %, more preferably between 0 at % and 0.1 at %, most preferably between 0 at % and 0.01 at %, most preferably of all between 0 at % and 0.001 at %, absolutely most preferably between 0 at % and 0.0001 at %.

The thickness of the sacrificial layer is less than 1000 nm, preferably less than 100 nm, more preferably less than 10 nm, most preferably less than 1 nm. The ratio of the thickness of the sacrificial layer to the thickness of the substrates, especially of bond regions of the substrates, is less than 1, preferably less than $10^{-2}$, preferably less than $10^{-4}$, more preferably less than $10^{-6}$, still more preferably less than $10^{-8}$.

The sacrificial layer can be applied to at least one of the contact surfaces by any deposition methods. Deposition methods are preferred which produce a sacrificial layer which is as coarse-grained as possible and/or at least predominantly single-crystalline. Deposition methods which are conceivable are especially the following:
  atomic layer deposition,
  electrochemical deposition,
  physical vapor deposition (PVD),
  chemical vapor deposition (CVD),
  vapor phase deposition by condensation and/or resublimation such as for example the direct deposition of water from water vapor on a surface,
  plasma deposition
  wet chemical deposition methods,
  sputtering and/or
  molecular beam epitaxy.

It is advantageous if the sacrificial layer, especially Si, is applied in-situ jointly with the bond layer, especially Cu, onto the substrate. This prevents the formation of oxide on the bond layer.

The sacrificial layer is comprised especially of a material which is suitable for the formation of a prebond and has a solubility in the bond region and/or bulk region on the contact surfaces of at least one of the substrates which are to make contact with one another. The sacrificial layer is comprised especially at least partially, preferably predominantly, of at least one of the following materials or substances:
  metals, especially
    Cu, Ag, Au, Al, Fe, Ni, Co, Pt, W, Cr, Pb, Ti, Te, Sn and/or Zn,
  alloys,
  semiconductors (with corresponding doping) especially
    elemental semiconductors, preferably
      Si, Ge, Se, Te, B and/or ($\alpha$)-Sn,
    compound semiconductors, preferably
      GaAs, GaN, InP, $In_xGE_{1-x}N$, InSb, InAs, GaSb, AlN, InN, GaP, BeTe, ZnO, $CuInGaSe_2$, ZnS, ZnSe, ZnTe, CdS, CdSe, CdTe, Hg(1-x)Cd(x)Te, BeSe, HgS, $Al_xGa_{1-x}As$, GaS, GaSe, GaTe, InS, InSe, InTe, $CuInSe_2$, $CuInS_2$, $CuInGaS_2$, SiC and/or SiGe,
    organic semiconductors, preferably
      flavanthone, perinone, Alq3, perinone, tetracene, chinacridone, pentacene, phthalocyanine, polythiophene, PTCDA, MePTCDI, acridone and/or indanthrone.
  liquids, especially
    water,
    alcohols
    aldehydes,
    ketones,
    ethers,
    acids,
    bases.

In a first embodiment of the invention the bond region is a layer which extends over the entire contact surface of the substrate. The roughness of the surface of the bond region is reduced especially by known methods. Preferably a chemical-mechanical polishing process (CMP) is used. Accordingly the entire bond region surface is covered with the sacrificial layer. The sacrificial layer is applied in such a way or after application is treated in such a way that the average roughness is less than 1 µm, preferably less than 500 nm, more preferably less than 100 nm, still more preferably less than 10 nm, most preferably less than 1 nm.

In a second embodiment of the invention there are several bond regions which are distributed over the entire contact surface. The bond regions form especially a topography which projects over the contact surface of at least one of the substrates, therefore projects beyond its surface. Preferably the bond regions are surrounded by any bulk material. The surfaces of the bulk material and the bond region surface form especially a common plane E. The surfaces which are comprised of conductive regions and which are surrounded by nonconductive regions are also known as hybrid surfaces. The nonconductive regions are comprised of a dielectric and insulate the conductive regions. The conceivably simplest embodiment would be contact sites which are insulated by dielectrics for charge transport. By bonding these hybrid surfaces a conductive connection between the substrates can be achieved via the bonded contact sites.

The sacrificial layer is deposited in a blanket manner on the contact surfaces therefore both on the bulk material surface and also the bond region surfaces. The local bond regions are especially copper pads, metal joints or metal frames for the packaging. Cu pads are used especially for electrical connection between functional units in the different layer systems. Metal joints could be especially through silicon vias (TSVs). A metal frame can be for example micropackaging for a MEMS device. These functional units were not shown in the drawings, for the sake of clarity.

In a third embodiment of the invention there are several bond regions which are distributed over the entire contact surface directly within the substrate, the substrate being structured first by etching techniques and afterwards filled with the corresponding bond region material and then covered by the sacrificial material.

In a bond step of the invention the two substrates which are made as any layer systems are caused to approach one another so that the sacrificial layer(s) which have been applied to the contact surfaces touch one another and form a prebond. The roughnesses of the sacrificial layer surfaces can be largely reduced by chemical and/or mechanical methods, preferably eliminated. In certain layer systems the layer systems can be aligned to one another in an aligner before the prebond.

Before prebonding, the sacrificial layer surfaces can be wetted with a liquid, preferably water. Preferably the applied liquid layer is thinner than 100 nm, more preferably thinner than 10 nm, most preferably thinner than 1 nm, most preferably of all only a monolayer. For hydrophilic surfaces it is sufficient to expose the substrate to the ambient atmosphere. The surface is then wetted by water vapor from the atmosphere.

The liquid can be applied especially by condensation. In one special embodiment the substrate to be coated, preferably in the cooled state, is placed in a heated space with a vapor-saturated atmosphere. The liquid condenses suddenly on the substrate surface due to the low temperature of the substrate.

In one alternative version of the invention the material of the sacrificial layer, especially as a liquid, is applied by a spin resist application process.

In another alternative version of the invention the material of the sacrificial layer is sprayed, especially as a liquid, onto the contact surface of at least one of the substrates by a spray resist application unit.

In special embodiments the water is introduced by a bubbler into the reaction chamber in which the substrate is located. To do this, inert gases such as for example argon, helium, and nitrogen are driven through a water bath. The inert gas supports the water during evaporation and saturates the reaction chamber with water vapor. The water condenses on the surface of the substrate and forms a very thin water film. Cooling the substrate can support the condensation of the water.

In another special embodiment, the water is vaporized in a simple vaporizer and routed onto the surface of the substrate. In contrast to the bubbler, an inert gas is not necessarily used, but the water temperature is brought as near as possible to the boiling point in order to increase the kinetic energy of the water and thus to accelerate the vaporization. By evacuating the reaction chamber the boiling point can be lowered accordingly and the process thus optimized.

From the consideration that special reaction chambers can be built which can precisely deposit the sacrificial layers, accordingly a unit also arises, hereinafter called the reaction chamber.

The prebond is preferably initiated at one contact point of the contact surfaces and spreads over the entire surface by a bond wave. The contact of the two sacrificial layer surfaces can be produced especially by a pin which bends one of the two substrates so that the contact surface of this substrate is convexly deformed and is brought into contact with the sacrificial layer surface of the second substrate which lies in particular flat on a receiving surface.

After the formation of the prebond the two bonded substrates are heat-treated. The heat treatment takes place at temperatures which are as low as possible, ideally at room temperature. The temperature here is less than 500° C., preferably less than 400° C., more preferably less than 300° C., still more preferably less than 200° C., most preferably less than 100° C., most preferably of all less than 50° C.

A version of the sacrificial layer which is very thin enables a rapid diffusion of atoms of the sacrificial layer, especially solely, into the bond regions. The diffusion is accelerated and/or promoted by heat treatment. Preferably the atoms of the sacrificial layer dissolve completely in the material of the bond region and/or of the bulk material. A process is also conceivable in which the atoms of the bond regions dissolve in the sacrificial layer; viewed technically, this is identical to the above described version due to the extremely small thickness of the sacrificial layer.

Preferably the substrates are exposed to pressure during the diffusion process of the atoms of the sacrificial layer into the bond regions. The pressure on the surface is especially between 0.01 MPa and 10 MPa, preferably between 0.1 MPa and 8 MPa, more preferably between 1 MPa and 5 MPa, most preferably between 1.5 MPa and 3 MPa. These values correspond roughly to application of a force of 1 kN to 320 kN for a 200 mm substrate.

The surface of the sacrificial layer prior to the prebond process should be free of contamination and/or at least predominantly, preferably completely, free of oxides. In particular it can also be necessary to remove oxide from the material on which the sacrificial layer is applied before the sacrificial layer is applied. Prior to a prebond process of the invention therefore preferably the sacrificial layer surface is cleaned. The removal of oxides can take place by physical and/or chemical means which are known to one skilled in the art. They include chemical reduction by gases and/or liquids with corresponding removal of the waste products, mechanical removal of the oxides by sputtering and/or plasma and/or CMP and/or one or more of the following methods:

Chemical oxide removal, especially
gaseous reducing agents,
liquid reducing agents,
Physical oxide removal, especially
plasma,
ion assisted chemical etching,
fast ion bombardment (FAB, sputtering),
grinding,
polishing.

Chemical oxide removal is defined as the removal of the oxide by a chemical process. A chemical process is defined as a transformation. In this case the oxide is reduced by a reducing agent in the gaseous and/or liquid phase and the reducing agent is oxidized accordingly into a new compound. The oxidized reducing agent, therefore the reaction product, is removed accordingly. A typical reducing agent is for example hydrogen.

Physical oxide removal is defined as the removal of the oxide by a physical process. In a physical process transformation does not take place, but rather a purely mechanical removal of the oxide from the surface of the substrate. The most frequently used physical reduction technology is plasma technology. Here a plasma is produced which is accelerated by corresponding fields onto the surface of the substrate and a corresponding physical oxide removal is accomplished. The use of sputter technology is also conceivable. In contrast to the plasma, it is not a statistical multiparticle system which is produced in the reaction chamber, but ions which are produced in a prechamber and accelerated in a dedicated manner onto a substrate. Finally the grinding and polishing should be mentioned as oxide removal processes. The oxide is gradually removed by a grinding and polishing tool. Grinding and polishing are suitable mainly as a pretreatment process when very thick oxide layers in the micrometer range are involved. These methods are less suited for the correct removal of oxide layers in the nanometer range.

Detection of the surface cleanness can be done very quickly and easily with the contact angle method. It is known that it is not oxide surfaces, mainly of pure copper, which have rather hydrophilic properties. This is shown mainly by a very small contact angle. If the surface oxidizes to the oxide, in particular copper to copper oxide, the surface properties become more and more water-repellent. A measured contact angle is accordingly large. In order to display the change of the contact angle as a function of time and thus as a function of progressing copper oxide thickness, the contact angle of a water droplet was measured after defined units of time, proceeding from the instant of complete oxide removal of the native copper oxide. The contact angle approaches a saturation value with increasing time. This relationship could be explained with the change of the electron structure of the surface by the rapidly growing copper oxide. Starting from a certain copper oxide layer thickness, a further increase of the oxide no longer contributes significantly to the change of the electron structure of the surface; this is reflected in a logarithmic decline of the contact angle (see FIG. 4).

The oxides which arise in this way are preferably removed before coating of the bond region surfaces and/or bulk material surfaces with the sacrificial layer surfaces and/or before bonding of the sacrificial layer surfaces to one another. The contact angle method which is mentioned here is used for prompt, precise and cost-effective evaluation of the oxide state. It manages without complicated chemical and/or physical analysis apparatus. Contact angle measuring devices can be installed in corresponding module groups of the device for fully automatic measurement and characterization of surfaces. Alternative measurement methods would be ellipsometry or any other known optical and/or electrical methods.

In another embodiment of the invention, a bond process between the bond region surfaces is carried out with water as the sacrificial layer. The idea is comprised of cleaning the oxide completely off the bond region surfaces and wetting the bond region surfaces with water which allows a prebond between the bond region surfaces at room temperature in a subsequent step which directly follows the oxide removal. The wetting takes place by one of the already mentioned possibilities, such as PVD, CVD, spin resist application, vapor phase deposition or the exposure of the substrate surface in an atmosphere which has a relatively high atmospheric humidity, preferably is even saturated with water vapor.

The application of the sacrificial layers takes place in a reaction chamber. Preferably the reaction chamber can be evacuated. The especially continuous evacuation of the reaction chamber is furthermore advantageous to enable dedicated setting of the atmosphere. Preferably the reaction chamber is a part of a module of a vacuum cluster, preferably part of a low vacuum cluster, more preferably part of a high vacuum cluster, most preferably part of an ultrahigh vacuum cluster. The pressure in the reaction chamber is less than 1 bar, preferably less than $10^{-1}$ mbar, more preferably less than $10^{-3}$ mbar, most preferably less than $10^{-5}$ mbar, most preferably of all less than $10^{-8}$ mbar.

Other advantages, features and details of the invention will become apparent from the following description of preferred exemplary embodiments and using the drawings.

DETAILED DESCRIPTION OF THE INVENTION

In the figures, the same components or components with the same effect are identified with the same reference numbers. The drawings show only schematically the embodiments of the invention and are not to scale. Thus mainly the relative thicknesses of the sacrificial layer, the bond regions and the substrates are disproportionate to one another, in exactly the same way as the ratio of the indicated thicknesses to the diameter of the substrates.

Figure 1:
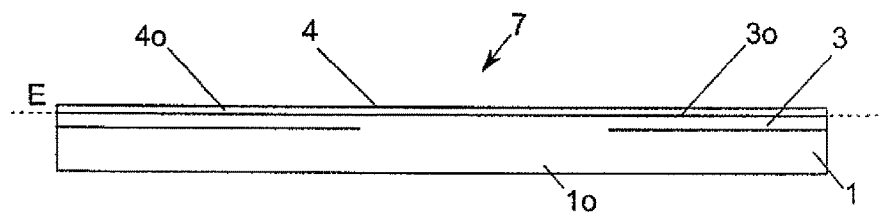
FIG. 1 shows a side view of a first embodiment of the invention with a blanket bond region.

FIG. 1 shows a layer system 7 comprising a first substrate 1 with an interface 1o, a bond region 3 with a bond region surface 3o, and the sacrificial layer 4 with the sacrificial layer surface 4o. The bond region 3 extends in the first embodiment over the entire interface 1o of the substrate 1. The bond region surface 3o in this case forms a first contact surface of the first substrate 1. The bond region 3 can be in particular a material-integral (therefore comprising the same material) and/or monolithic component of the first substrate 1. The sacrificial layer 4 is applied in a blanket manner on the first contact surface.

Figure 2:
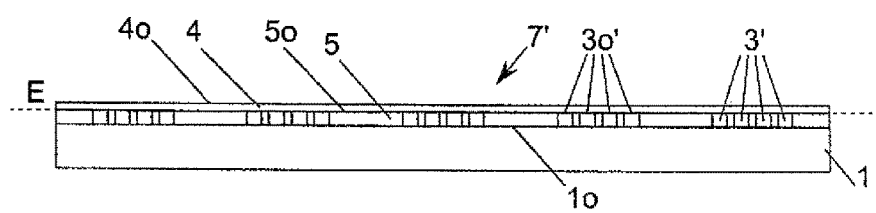
FIG. 2 shows a side view of a second embodiment of the invention with several local bond regions.

FIG. 2 shows a layer system 7' in which several bond regions 3' which are preferably regularly distributed over the interface 1o with corresponding bond region surfaces 3o' are applied on the first substrate. The bond regions 3' thus form a topography over the surface 1o of the substrate 1. In the illustrated preferred embodiment the bond regions 3' are surrounded by a bulk material 5. The bulk material can be any metal, nonmetal, a ceramic or a polymer, such as for example a resist. Preferably it will be in any case a ceramic, especially $Si_xN_4$ or $Si_xO_xN_x$, still more preferably an oxide ceramic, especially $SiO_2$. The bond region surfaces 3' and the bulk material surfaces 5o form a common plane E, specifically the first contact surface. The evenness of the bond region surfaces 3' and of the bulk material surfaces 5o as well as their coplanarity allow an optimum deposition of the sacrificial layer 4 on the first contact surface.

Figure 3:
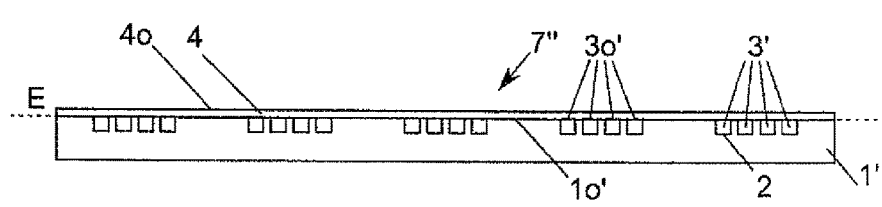
FIG. 3 shows a side view of a third embodiment of the invention with several local bond regions in the substrate.
Figure 4:
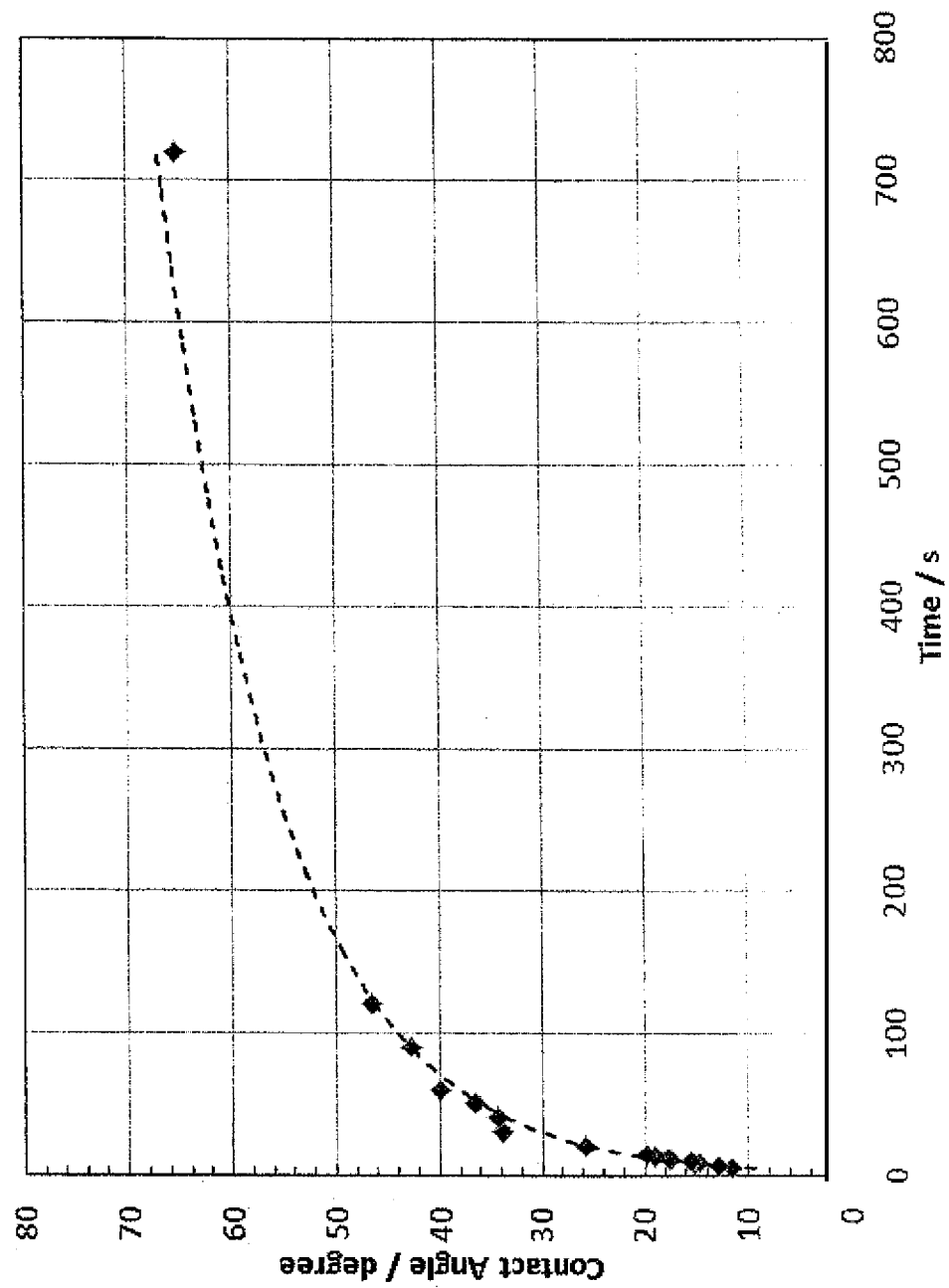
FIG. 4 shows empirical measurement data of the contact angle between the liquid droplet edge and the surface of copper/copper oxide, as a function of time.
Figure 5:
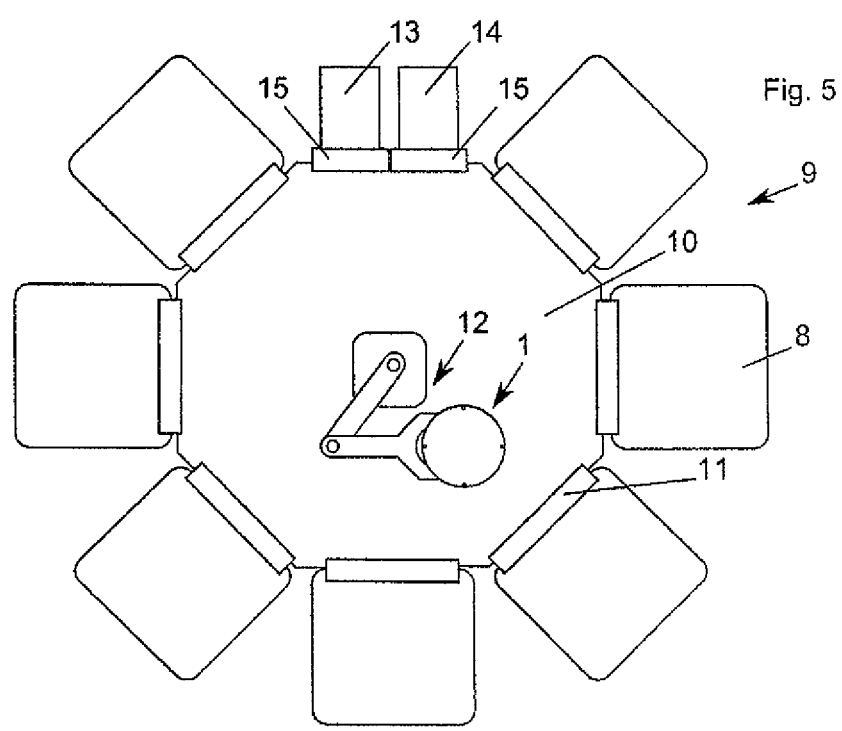
FIG. 5 shows a schematic plan view of a cluster system which contains the device.

FIG. 3 shows a layer system 7" comprising a structured first substrate 1' with an interface 1o' and several bond regions 3' which are distributed preferably regularly in the substrate 1', with bond region surfaces 3o'. The substrate 1 has been structured by etching so that cavities 2 have formed in the substrate 1'. The cavities 2 which have formed in this manner are filled with the material for the bond regions 3', especially using a PVD or CVD process. The material of the bond regions 3' which has been deposited over the common plane E is then removed by a backthinning process. Removal as far as the plane E by grinding processes, polishing processes, chemical-mechanical polishing, etc. would be conceivable. The substrate 1' which has been produced in this way with the cavities 2 which by filling with material form the bond regions 3' and thus jointly the contact surface is then covered on the latter with the sacrificial layer 4.

The deposition of the sacrificial layers 4 for all embodiments of the invention can take place such that the material for the sacrificial layer 4 is deposited until the necessary layer thickness is achieved. The second method includes making the sacrificial layer 4 thicker than desired in a first step and reducing it to the desired thickness in a second step, a backthinning process. In this case the use of grinding processes and/or polishing processes and/or chemical-mechanical polishing would also be conceivable. In the case of liquid sacrificial layers the required layer thickness can also be continuously built up by the sacrificial layer being allowed to grow. Thus, it is known for example which equilibrium layer thickness arises on the surface of a substrate when an atmosphere with corresponding atmospheric humidity is produced. A well defined layer thickness on the substrate surface can be produced by the dedicated control of temperature, pressure and moisture content.

Figure 6:
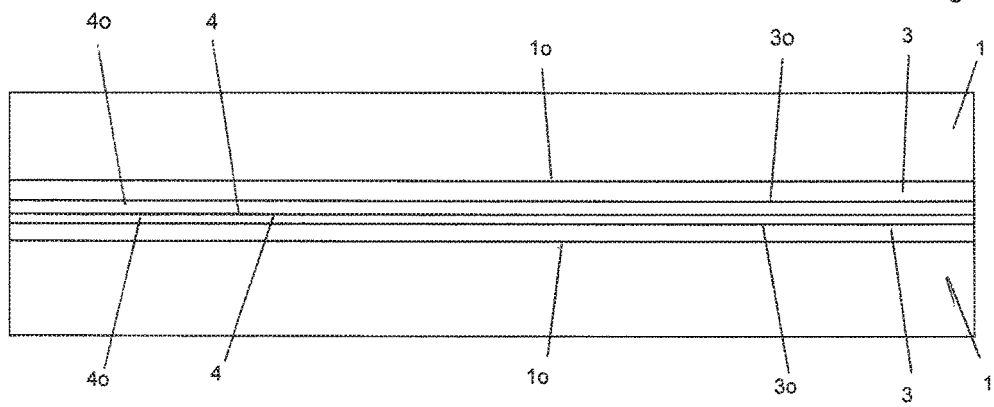
FIG. 6 shows a side view of the first embodiment of the invention in which two layer systems with blanket bond regions are bonded to one another.
Figure 7:
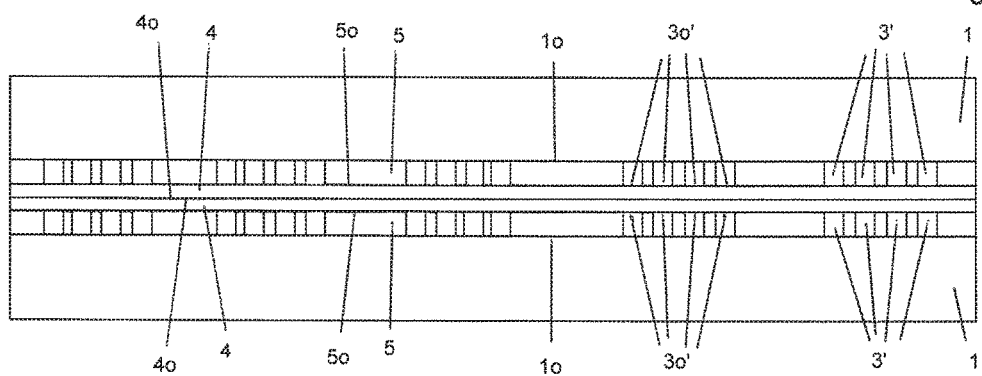
FIG. 7 shows a side view of the second embodiment of the invention in which two layer systems with blanket bond regions are bonded to one another.
Figure 8:
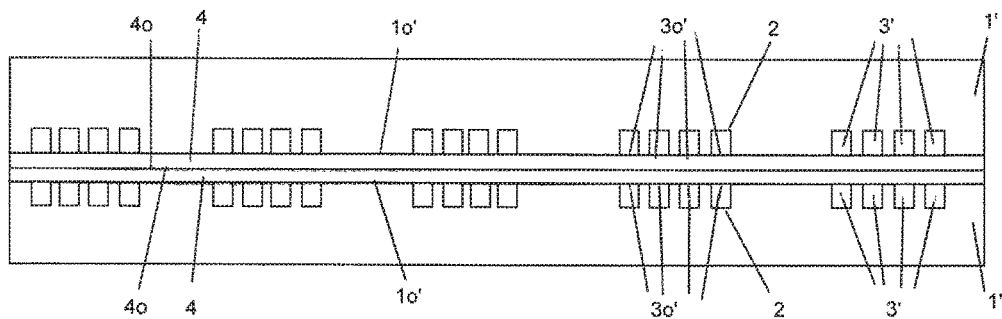
FIG. 8 shows a side view of a third embodiment of the invention with a blanket bond region

As is respectively shown in FIGS. 6-8, two layer systems 7, 7', 7" are produced, they are bonded to one another at low temperatures and/or with low pressures on the bond regions with the formation of a prebond.

Before prebonding, the sacrificial layer surfaces 4o can be wetted in addition with a liquid, preferably water. Preferably the applied water layers are thinner than 100 nm, more preferably thinner than 10 nm, most preferably thinner than 1 nm, most preferably of all only a monolayer. For example, the use of a bilayer system comprising one $SiO_2$ layer and one water layer located on it would be conceivable. The $SiO_2$ layer is for example roughly 1.5 nm thick, the water layer on the $SiO_2$ layer arises solely by the condensation of the water molecules in the atmosphere.

During and/or prior to the approach process, the two substrates 7, 7', 7" can be aligned via alignment marks and/or other alignment features along the plane E in the x and/or y direction. The contact of the two sacrificial layers 4 to one another takes place preferably at one point by one of the two substrates 1, 1' being convexly shaped by a pin. After the two sacrificial layer surfaces 4o make contact, a bond wave is formed which strongly joins the two sacrificial layer surfaces to one another by a prebond.

In another method step of the invention, heat treatment and/or a bond step is carried out at low temperatures. The increased temperature and/or the action of a force leads to a diffusion of the atoms of the sacrificial layers 4 into the bond regions 3, 3'. The atoms of the sacrificial layers 4 are preferably completely dissolved in the bond regions 3, 3' and/or the bulk material 5 surrounding them and thus lead to an inventive direct bond of the bond region materials at temperatures as low as possible. The direct bond can take place for example by one of the methods in patent EP2372755 or patent PCT/EP2012/069268 to which reference is made in this respect.

The embodiment of the invention for producing sacrificial layers is preferably part of a module 8 (sacrificial layer module) of a cluster 9, especially a low vacuum cluster, preferably a high vacuum cluster, most preferably an ultrahigh vacuum cluster. The cluster 9 includes an interior space 10 which can be evacuated and which can be separated hermetically to all existing modules via module lock doors 11. Within the interior space 10 a robot 12 transports the product wafer 1 from module to module. The product wafers 1 travel via a cluster lock 15 of one input FOUP 13 for the incoming product wafer into the interior space 10. After successful processing of the product wafer 1 within the cluster 9, the robot 12 deposits the product wafer 1 again via a FOUP lock 15 in one output FOUP 14.

REFERENCE NUMBER LIST 1, 1' substrate
1o, 1o' interface
2 cavities
3, 3' bond region
3o, 3o' bond region surface
4 sacrificial layer
4o sacrificial layer surface
5 bulk material
5o bulk material surface
7, 7', 7" layer systems
8 module
9 cluster
10 interior space
11 module lock door
12 robot
13 input FOUP
14 output FOUP
15 cluster lock door Having described the invention, the following is claimed:

1. A method for bonding of a first, at least partially metallic, contact surface of a first substrate to a second, at least partially metallic, contact surface of a second substrate, the first and second contact surfaces being formed as hybrid surfaces, the method comprising:
   removing oxides from the first and second contact surfaces,
   applying a sacrificial layer to at least one of the first and second contact surfaces, the sacrificial layer being at least predominantly soluble in material of at least one of the first and second contact surfaces, and
   bonding the first and second substrates with a solution of the sacrificial layer in the at least one of the first and second contact surfaces,
   wherein the sacrificial layer is comprised of water,
   wherein the at least one of the first and second contact surfaces is formed of several bond regions of the first and second substrates and bulk material which surrounds the bond regions.

2. The method as claimed in claim 1, wherein the sacrificial layer is applied with a thickness of less than 1000 nm.

3. The method as claimed in claim 1, wherein a ratio of a thickness of the sacrificial layer to a thickness of the first and second substrates is less than 1.

4. The method as claimed in claim 1, wherein at least one of the first and second contact surfaces is located in blanket fashion on one bond region of the first and second substrates.

5. The method as claimed in claim 1, wherein the sacrificial layer consists completely of water.

6. The method as claimed in claim 1, wherein the sacrificial layer is applied with a thickness of less than 100 nm.

7. The method as claimed in claim 1, wherein the sacrificial layer is applied with a thickness of less than 10 nm.

8. The method as claimed in claim 1, wherein the sacrificial layer is applied with a thickness of less than 1 nm.

9. The method as claimed in claim 1, wherein a ratio of a thickness of the sacrificial layer to a thickness of the first and second substrates is less than $10^{-2}$.

10. The method as claimed in claim 1, wherein a ratio of a thickness of the sacrificial layer to a thickness of the first and second substrates is less than $10^{-4}$.

11. The method as claimed in claim 1, wherein a ratio of a thickness of the sacrificial layer to a thickness of the first and second substrates is less than $10^{-6}$.

12. The method as claimed in claim 1, wherein a ratio of a thickness of the sacrificial layer to a thickness of the first and second substrates is less than $10^{-8}$.

13. A method for bonding of a first, at least partially metallic, contact surface of a first substrate to a second, at least partially metallic contact surface of a second substrate, the first and second contact surfaces being formed as hybrid surfaces, the method comprising:
   removing oxides from the first and second contact surfaces,
   respectively forming a plurality of cavities in at least one of the first and second substrates to define metallic bond regions in at least one of the first contact surface of the first substrate and the second contact surface of the second substrate,
   applying a sacrificial layer to the at least one of the first and second contact surfaces, the sacrificial layer being at least predominantly soluble in material of the at least one of the first and second contact surfaces, and
   bonding the first and second substrates with a solution of the sacrificial layer in the at least one of the first and second contact surfaces,
   wherein the sacrificial layer is comprised of water.

* * * * *